US008604405B2

(12) United States Patent
Liu et al.

(10) Patent No.: US 8,604,405 B2
(45) Date of Patent: Dec. 10, 2013

(54) BACKSIDE ILLUMINATED IMAGE SENSOR DEVICE WITH REFRACTIVE INDEX DEPENDENT LAYER THICKNESSES AND METHOD OF FORMING THE SAME

(75) Inventors: Han-Chi Liu, Miaoli County (TW); Jeng-Shyan Lin, Tainan (TW); Dun-Nian Yaung, Taipei (TW); Jen-Cheng Liu, Hsin-Chu (TW); Wen-De Wang, Minsyong Township, Chiayi County (TW); Chun-Chieh Chuang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 449 days.

(21) Appl. No.: 12/415,580

(22) Filed: Mar. 31, 2009

(65) Prior Publication Data

US 2010/0243868 A1    Sep. 30, 2010

(51) Int. Cl.
  *H01L 27/00* (2006.01)
  *H01J 40/14* (2006.01)

(52) U.S. Cl.
  USPC ........................................ 250/208.1; 250/226

(58) Field of Classification Search
  USPC ............... 250/208.1, 226, 216; 348/272–283, 348/294–323; 438/57, 59, 60, 64–67, 69, 438/70, 73–81; 257/420, 431–440, 443, 257/448
  See application file for complete search history.

(56) References Cited

U.S. PATENT DOCUMENTS

| 4,588,261 | A  | * | 5/1986  | Erhardt ........................ 257/432 |
|-----------|----|---|---------|-----------------------------------------|
| 7,208,783 | B2 | * | 4/2007  | Palsule et al. ................. 257/233 |
| 7,560,684 | B2 | * | 7/2009  | Matsuda et al. ................ 250/226  |
| 7,601,987 | B2 | * | 10/2009 | Koda et al. ..................... 257/79 |
| 7,875,948 | B2 | * | 1/2011  | Hynecek et al. ............... 257/447   |
| 7,982,177 | B2 | * | 7/2011  | Nozaki et al. ................. 250/239  |
| 2008/0099804 | A1 | * | 5/2008 | Venezia et al. ................ 257/291  |
| 2008/0283726 | A1 | * | 11/2008 | Uya et al. .................... 250/208.1 |
| 2009/0200624 | A1 | * | 8/2009 | Dai et al. ..................... 257/432  |
| 2009/0200631 | A1 | * | 8/2009 | Tai et al. ..................... 257/435  |

* cited by examiner

*Primary Examiner* — Pascal M Bui Pho
(74) *Attorney, Agent, or Firm* — Haynes and Boone, LLP

(57) ABSTRACT

Provided is an image sensor device. The image sensor device includes a device substrate having a front side and a back side. The device substrate has a radiation-sensing region that can sense radiation that has a corresponding wavelength. The image sensor also includes a first layer formed over the front side of the device substrate. The first layer has a first refractive index and a first thickness that is a function of the first refractive index. The image sensor also has a second layer formed over the first layer. The second layer is different from the first layer and has a second refractive index and a second thickness that is a function of the second refractive index.

20 Claims, 9 Drawing Sheets

BACKSIDE ILLUMINATED IMAGE SENSOR DEVICE WITH REFRACTIVE INDEX DEPENDENT LAYER THICKNESSES AND METHOD OF FORMING THE SAME

FIELD OF THE INVENTION

The present disclosure relates generally to a semiconductor device, and more particularly, to an image sensor device.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected towards the substrate and convert the sensed radiation into electrical signals. Thus, an image sensor's efficiency in sensing the projected radiation depends on how much radiation is absorbed by the pixels. However, image sensors fabricated using current technologies are not optimized for the absorption of radiation by the pixels. Thus, while existing methods of fabricating image sensors have been generally adequate for their intended purposes, they have not been entirely satisfactory in every aspect.

SUMMARY

One of the broader forms of the present disclosure involves an image sensor device that includes: a device substrate having a front side and a back side, the device substrate having a radiation-sensing region operable to sense radiation that has a corresponding wavelength; a first layer formed over the front side of the device substrate, the first layer having a first refractive index and a first thickness that is a function of the first refractive index; and a second layer formed over the first layer, the second layer being different from the first layer and having a second refractive index and a second thickness that is a function of the second refractive index.

Another of the broader forms of the present disclosure involves a method of fabricating a semiconductor device that includes: providing a device substrate having a front side and a back side; forming a radiation-sensing region in the device substrate, the radiation-sensing region operable to sense radiation that has a corresponding wavelength; forming a first layer over the front side of the device substrate, the first layer having a first refractive index and a first thickness that is a function of the first refractive index; and forming a second layer over the first layer, the second layer being different from the first layer and having a second refractive index and a second thickness that is a function of the second refractive index.

Still another of the broader forms of the present disclosure involves an image sensor device that includes: a device substrate having a front side and a back side; a pixel formed in the device substrate, the pixel being operable to sense light projected toward the back side of the device substrate, the light having a corresponding wavelength; a first dielectric layer formed over the front side of the device substrate, the first dielectric layer having a first refractive index and a first thickness that is a function of the first refractive index and the wavelength; and a second dielectric layer formed over the first dielectric layer, the second dielectric layer having a second refractive index and a second thickness that is a function of the second refractive index and the wavelength.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
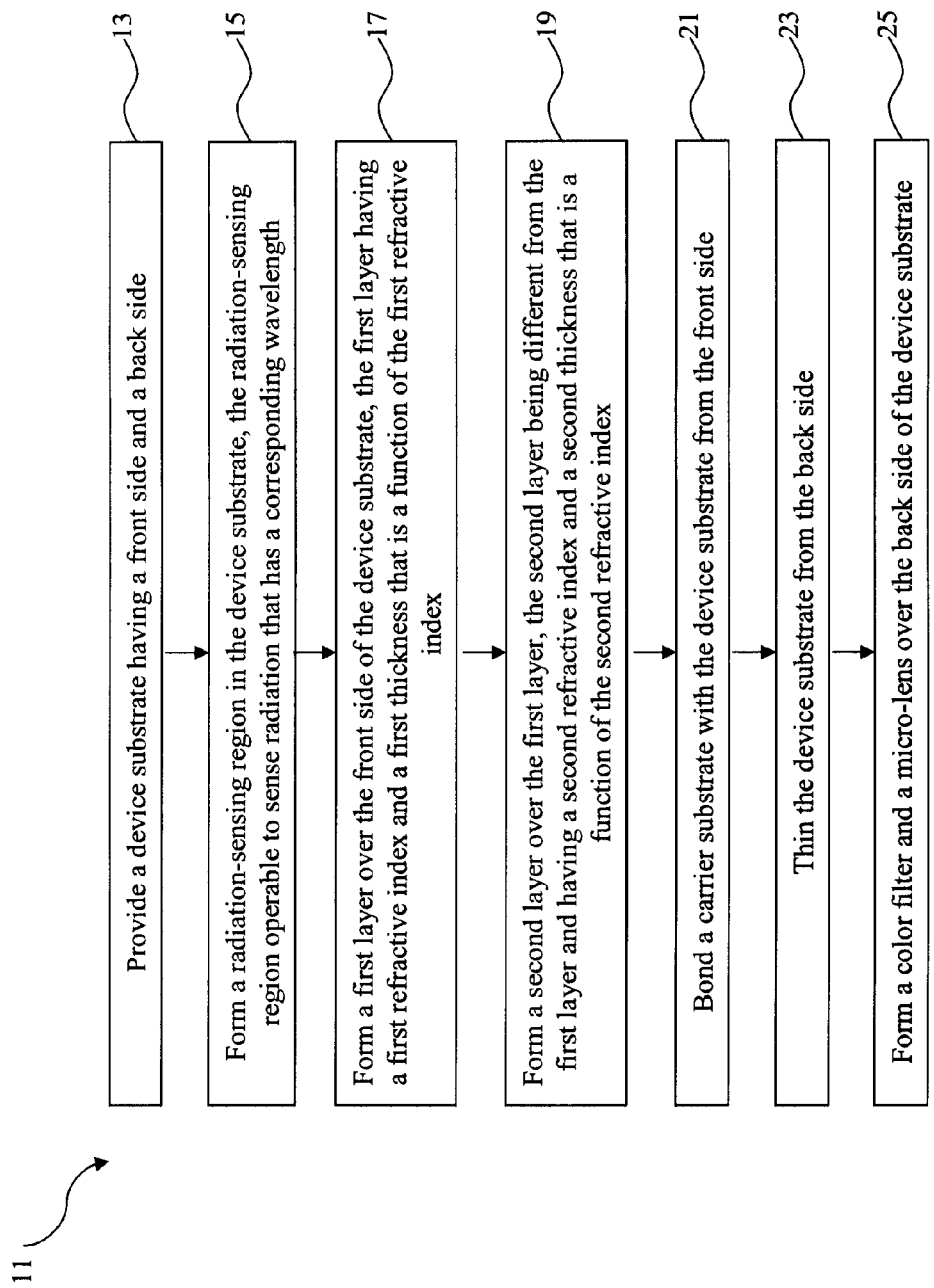
FIG. 1 is a flowchart illustrating a method for fabricating a semiconductor device according to various aspects of the present disclosure.

Illustrated in FIG. 1 is a flowchart of a method 11 for fabricating a back-side illuminated (BSI) image sensor device that has an enhanced quantum efficiency according to various aspects of the present disclosure. Referring to FIG. 1, the method 11 begins with block 13 in which a device substrate having a front side and a back side is provided. The method 11 continues with block 13 in which a radiation-sensing region is formed in the device substrate. The radiation-sensing region is operable to sense radiation that has a corresponding wavelength. The method 11 continues with block 15 in which a first layer is formed over the front side of the device substrate. The first layer has a first refractive index and a first thickness that is a function of the first refractive index. The method 11 continues with block 17 in which a second layer is formed over the first layer. The second layer is different from the first layer and has a second refractive index and a second thickness that is a function of the second refractive index. The method 11 continues with block 19 in which an interconnect structure is formed over the second layer. The interconnect structure has a metal film that is aligned with the radiation-sensing region and is operable to reflect the radiation toward the radiation-sensing region. The method 11 continues with block 21 in which a carrier substrate is bonded with the device substrate from the front side. The method 11 continues with block 23 in which the device substrate is thinned from the back side. The method 11 continues with block 25 in which a color filter and a micro-lens are formed over the back side of the device substrate.

FIGS. 2 to 9 are diagrammatic fragmentary sectional side views of various embodiments of an apparatus that is a BSI image sensor device 30 at various stages during its fabrication according to the method 11 of FIG. 1. The image sensor device 30 includes an array or grid of pixels for sensing and recording an intensity of radiation (such as light) directed toward a back-side of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 9 have been simplified for a better understanding of the inventive concepts of the present disclosure.

Figure 2:
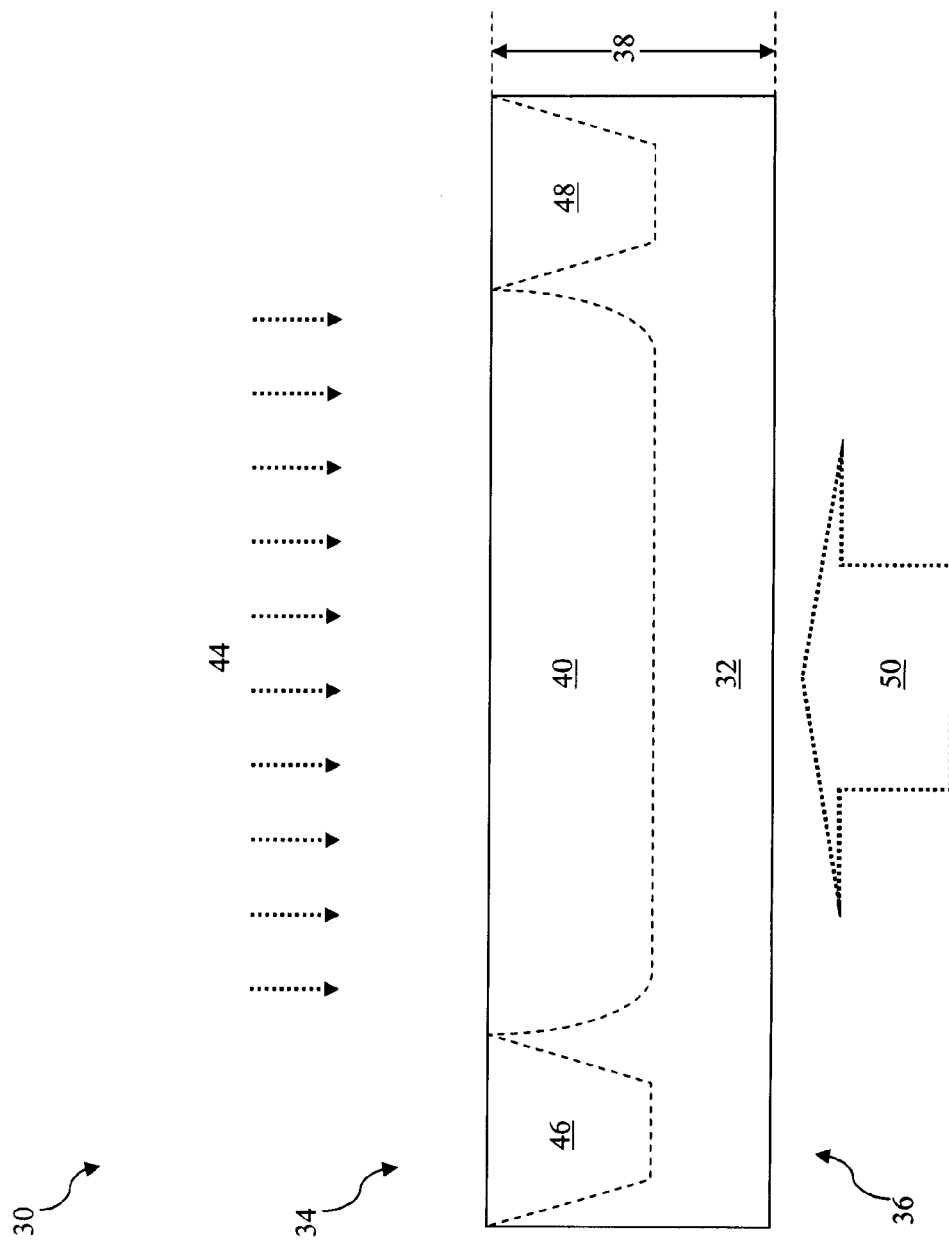
FIGS. 2-9 are diagrammatic fragmentary sectional side views of the semiconductor device at various stages of fabrication in accordance with the method illustrated in FIG. 1.

With reference to FIG. 2, the image sensor 30 includes a device substrate 32. The device substrate 32 is a silicon substrate doped with a p-type dopant such as boron (for example a p-type substrate). Alternatively, the device substrate 32 could be another suitable semiconductor material. For example, the device substrate 32 may be a silicon substrate that is doped with an n-type dopant such as phosphorous or arsenic (for example an n-type substrate). The device substrate 32 could include other elementary semiconductors such as germanium and diamond. The device substrate 32 could optionally include a compound semiconductor and/or an alloy semiconductor. Further, the device substrate 32 could include an epitaxial layer (epi layer), may be strained for performance enhancement, and may include a silicon-on-insulator (SOI) structure. The device substrate 32 has a front side 34 and a back side 36. The device substrate 32 also has an initial thickness 38 that is in a range from about 100 microns (um) to about 3000 um. In the present embodiment, the initial thickness 38 is about 700 um.

A radiation-sensing region—for example, a pixel 40—is formed in the device substrate 32. The pixel 40 includes a photodiode in the present embodiment. In other embodiments, the pixel 40 may include pinned layer photodiodes, photogates, reset transistors, source follower transistors, and transfer transistors. For the sake of simplicity, only one pixel 40 is illustrated in FIG. 2, but it is understood that any number of pixels 40 may be implemented in the device substrate 32. The pixel 40 in the present embodiment is formed by performing an implantation process 44 on the device substrate 32. The implantation process 44 includes doping the device substrate 32 with a p-type dopant such as boron. In other embodiments, the implantation process 44 may include doping the device substrate 32 with an n-type dopant such as phosphorous or arsenic. The device substrate 32 also includes isolation structures 46 and 48 on either side of the pixel 40, so that the pixel 40 can be electrically isolated from adjacent pixels (not illustrated). The isolation structures 46 and 48 include shallow trench isolation (STI) structures that are formed of a dielectric material such as silicon oxide. In other embodiments, the isolation structures 46 and 48 may include doped isolation features, such as heavily doped n-type regions.

The pixel 35 is operable to sense radiation projected towards the back side 36 of the substrate, such as an incident light 50 (subsequently referred to as light 50). The light 50 includes a corresponding wavelength that correlates to an observable color in a visible light spectrum. For example, red light includes a spectrum of light having a corresponding wavelength that is in a range from about 622 nanometers (nm) to about 780 nm; orange light includes a spectrum of light having a corresponding wavelength that is in a range from about 597 nanometers (nm) to about 622 nm; yellow light includes a spectrum of light having a corresponding wavelength that is in a range from about 577 nanometers (nm) to about 597 nm; and green light includes a spectrum of light having a corresponding wavelength that is in a range from about 492 nanometers (nm) to about 577 nm. For the sake of illustration, the light 50 has a corresponding wavelength that is about 650 nm (which corresponds to a red light) for the discussions that follow. An efficiency of the pixel 40 in sensing the light 50 depends partly on how much of the light 50 can be absorbed by the pixel 40. This efficiency may be referred to as a quantum efficiency of a pixel. A pixel having a higher quantum efficiency results in an image sensor having better photo response characteristics and performance. However, in existing technologies, a significant portion of the light 50 penetrates through the pixel 40 and does not get collected or absorbed by the pixel 40, thus limiting the quantum efficiency of the pixel 40. It has been observed that the quantum efficiency of the pixel 40 becomes more degraded as the wavelength of the light 50 increases.

Figure 3:
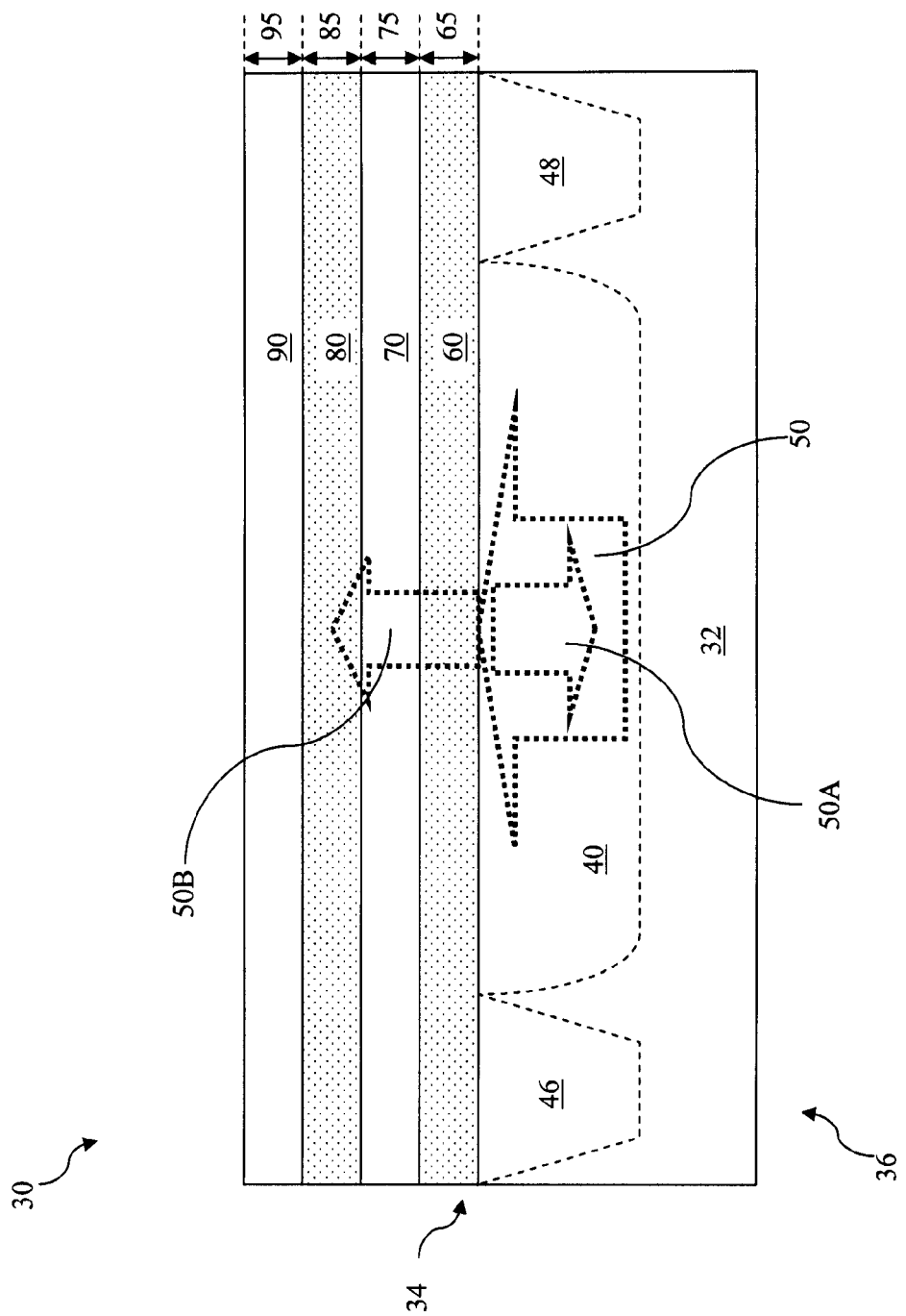

Referring now to FIG. 3, a layer 60 is formed over the front side 34 of the device substrate 32. The layer 60 is a dielectric layer and includes silicon oxide and may be formed by chemical vapor deposition (CVD), physical vapor deposition (PVD), atomic layer deposition (ALD), or combinations thereof, or by another suitable technique known in the art. The layer 60 has a refractive index value. In general, the refractive index value of a medium measures how much the speed of a wave—such as light or sound—is reduced when the wave is propagating (traveling) inside the medium in comparison to the speed of the wave propagating in a vacuum. For example, if a medium has a refractive index value of 2 for light, then light in the medium propagates at ½=0.5 times the speed of light in a vacuum. The refractive index value for a particular medium is also dependent on the wavelength or frequency of the wave. For the discussions regarding the present embodiment, the refractive index values discussed herein refer to the refractive index values of the respective media with respect to the light 50 that has a wavelength of about 650 nm. It is also known in the art that when a wave (such as light) propagates from a first medium to a second medium, the wave's angle of incidence changes if the two media have different refractive index values. The relationship between the refractive index values of the respective media and the respective angles of incidence is governed by Snell's law of refraction: refractive index value of medium 1*sine(angle of incidence 1)=refractive index value of medium 2*sine(angle of incidence 2). For the present embodiment, the refractive index value of the layer 60 is about 1.46.

The layer 60 has a thickness 65 that is a function of the wavelength of the light 50 and the refractive index value of the layer 60. In the present embodiment, the thickness 65 has a value that is approximately equal to (¼)*(the wavelength of the light 50)/(refractive index value of the layer 60), which is about 111 nm. The layer 60 also functions as a Resist Protective Oxide (RPO) layer. The RPO layer may function as a blocking/protective layer during a silicide process or other suitable process.

A layer 70 is then formed over the layer 60. The layer 70 includes silicon nitride and may be formed by CVD, PVD, ALD, or combinations thereof, or by another suitable technique known in the art. The layer 70 includes a refractive index value of about 2.3. The layer 70 includes a thickness 75 that is a function of the wavelength of the light 50 and the refractive index value of the layer 70. In the present embodiment, the thickness 75 has a value that is approximately equal to (¼)*(the wavelength of the light 50)/(refractive index value of the layer 70), which is about 70 nm. In an alternative embodiment, the layer 70 may optionally include silicon oxy-nitride which has a refractive index value of about 2. In the alternative embodiment, the thickness 75 of the layer 70 has a value that is approximately equal to (¼)*(the wavelength of the incident light 50)/(refractive index value of the layer 70), which is about 81 nm. The layer 70 also functions as a contact etch stop layer (CESL) in both the present embodiment and the alternative embodiment.

Thereafter, a layer 80 is formed over the layer 70. The layer 80 includes silicon oxide and may be formed by CVD, PVD, ALD, or combinations thereof, or by another suitable technique known in the art. The layer 80 includes a refractive index value of about 1.46. The layer 80 also includes a thickness 85 that is a function of the wavelength of the light 50 and the refractive index value of the layer 80. In the present embodiment, the thickness 85 has a value that is approximately equal to (¼)*(the wavelength of the light 50)/(refractive index value of the layer 70), which is about 111 nm. In other words, the refractive index value and the thickness 85 of the layer 80 are substantially equal to the refractive index value and the thickness 65 of the layer 60, respectively.

A layer 90 is then formed over the layer 80. The layer 90 includes silicon nitride and may be formed by CVD, PVD, ALD, or combinations thereof, or by another suitable technique known in the art. The layer 90 includes a refractive index value of about 2.3. The layer 90 also includes a thickness 95 that is a function of the wavelength of the light 50 and the refractive index value of the layer 90. In the present embodiment, the thickness 95 has a value that is approximately equal to (¼)*(the wavelength of the light 50)/(refractive index value of the layer 90), which is about 70 nm. In an alternative embodiment, the layer 90 may optionally include silicon oxy-nitride which has a refractive index value of about 2. In the alternative embodiment, the thickness 95 of the layer 90 has a value that is approximately equal to (¼)*(the wavelength of the light 50)/(refractive index value of the layer 90), which is about 81 nm. In other words, the refractive index value and the thickness 95 of the layer 90 are substantially equal to the refractive index value and the thickness 75 of the layer 70, respectively.

The layers 60, 70, 80, and 90 form a distributed Bragg reflector. The distributed Bragg reflector can be used to reflect radiation waves such as light. It is a structure formed from multiple layers of alternating materials with varying refractive index values and thicknesses, resulting in periodic variation in the effective refractive index in the reflector. Each layer's boundary causes a partial reflection of the radiation wave. For waves whose wavelength is close to four times of an optical thickness of the layers, where the optical thickness of a layer is defined as (refractive index value of a layer)*(thickness of the layer), the many reflections combine with constructive interference, and the layers act as a high-quality reflector for the radiation waves. A reflectivity of the distributed Bragg reflector is defined as the amount of reflected radiation divided by the incident radiation, which can be calculated from the following formula:

$$R = \left[\frac{1 - \frac{n_i}{n_t}\left(\frac{n_{r1}}{n_{r2}}\right)^{2N}}{1 + \frac{n_i}{n_t}\left(\frac{n_{r1}}{n_{r2}}\right)^{2N}}\right]^2$$

where R is the reflectivity of the distributed Bragg reflector, $n_i$ is a refractive index value of a medium surrounding a first layer of the distributed Bragg reflector, $n_t$ is a refractive index value of a medium surrounding a last layer of the distributed Bragg reflector, $n_{r1}$ is a refractive index value of a first layer of the distributed Bragg reflector, $n_{r2}$ is a refractive index value of a second layer of the distributed Bragg reflector, and N is the number of repeated pairs of the first and second layers in the distributed Bragg reflector.

In the present embodiment, the first layer of the distributed Bragg reflector is the layer 60 (which has a refractive index value of about 1.46), and the second layer of the distributed Bragg reflector is the layer 70 (which has a refractive index value of about 2.3). Thus, $n_{r1}$ and $n_{r2}$ have values that are about 1.46 and 2.3, respectively, in the present embodiment. The device substrate 32 surrounds the first layer of the distributed Bragg reflector, which is the layer 60. The device substrate 32 includes a silicon material and thus has a refractive index value of about 3.87 (3.87 being the refractive index value of silicon). Hence, $n_i$ has a value that is about 3.87 in the present embodiment. Further, though not illustrated in FIG. 3, a silicon oxide material surrounds the last layer—layer 90—of the distributed Bragg reflector. Hence, $n_t$ has a value that is about 1.46 in the present embodiment. Also, since the distributed Bragg reflector includes two pairs of alternating silicon oxide and silicon nitride layers in the present embodiment, N=2. It is understood that the materials and values given above are merely exemplary, and other embodiments may employ different materials to form the distributed Bragg reflector, and that the number of pairs of alternating layers N may be chosen to optimize design or manufacturing requirements. For example, in a first alternative embodiment N may be 1, in which case the distributed Bragg reflector includes one silicon oxide layer and one silicon nitride layer, and thus only one pair of layers having different refractive index values. In a second alternative embodiment, N may be 3, in which case the distributed Bragg reflector includes three silicon oxide layers and three silicon nitride layers, where the oxide and nitride layers are alternating. Thus, in the second alternative embodiment, the distributed Bragg reflector includes three pairs of layers having different and alternating refractive index values.

Referring back to FIG. 3, as the light 50 propagates through the image sensor 30, a portion of the light 50 is absorbed by the pixel 40. A remaining portion of the incident light 50 not absorbed by the pixel 40 continues to propagate toward the front side 34 of the device substrate 32. In part due to the presence of the distributed Bragg reflector formed by the layers 60-90, a portion of the unabsorbed light gets reflected back toward the back side 36 of the device substrate 32 as light 50A. This reflected light 50A may be absorbed again by the pixel 40, thus enhancing the quantum efficiency of the pixel 40 (and therefore the quantum efficiency of the image sensor 30). Another portion of the unabsorbed light travels through distributed Bragg reflector as light 50B and does not get absorbed by the pixel 40. As discussed above, the reflectivity of the distributed Bragg reflector may be expressed as the reflected light 50A divided by the incident light 50. It has been observed through simulations and experimentations that for an incident light 50 having a wavelength of about 650 nm, such as in the present embodiment, an N value of 2 results in a reflectivity of about 31%. Further, for N values of 1, 6, and 9, the corresponding reflectivity values are about 25%, 33%, and 34%, respectively.

Figure 4:
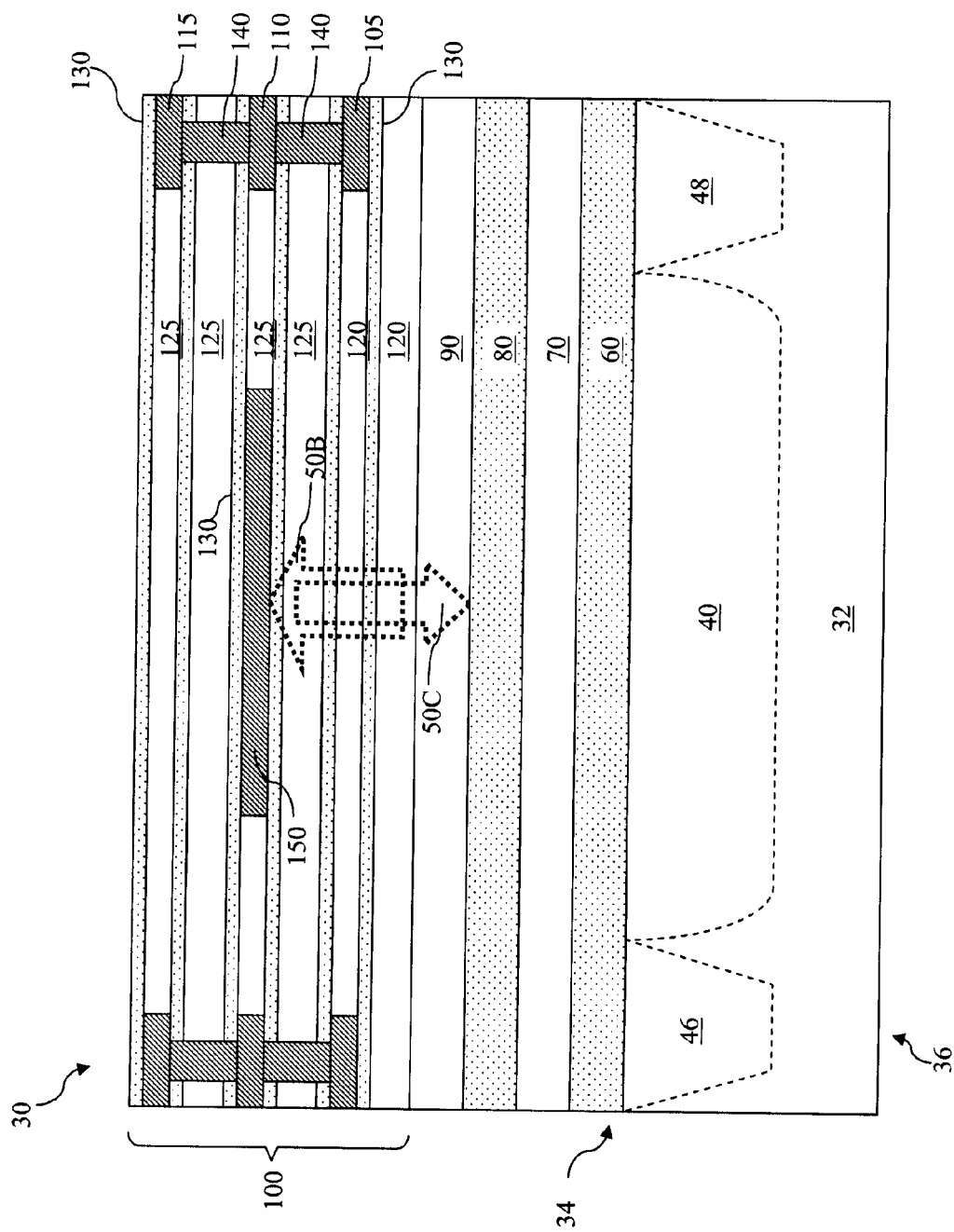

Referring now to FIG. 4, an interconnect structure 100 is formed over the layer 90. The interconnect structure 100 includes a plurality of conductive lines that provide interconnections (e.g., wiring) between various doped features (such as the pixel 40) in the device substrate 32, circuitry, and input/output features of the image sensor device 30. For the sake of illustration, conductive lines 105, 110, and 115 are shown in FIG. 4. The conductive lines 105, 110, and 115 may also be referred to as metal 1, metal 2, and metal 3 layers, respectively. In one embodiment, the interconnect structure 100 is an aluminum interconnect structure. For an aluminum interconnect structure 100, the conductive lines 105-115 are metal films that include aluminum, aluminum/silicon/copper alloy, titanium, titanium nitride, tungsten, polysilicon, metal silicide, or combinations thereof. The conductive lines 105-115 may be formed by a process including PVD (or sputtering), CVD, or combinations thereof. In another embodiment, the interconnect structure 100 is a copper interconnect structure. For a copper interconnect structure 100, the conductive lines 105-115 are metal films that include copper, copper alloy, titanium, titanium nitride, tantalum, tantalum nitride, tungsten, polysilicon, metal silicide, or combinations thereof. The conductive lines 105-115 may be formed by a process including CVD, sputtering, plating, or other suitable processes.

The conductive lines 105-115 are surrounded by an inter-level dielectric (ILD) layer 120, inter-metal dielectric (IMD) layers 125, and dielectric layers 130. The inter-level dielectric layer 120 and the inter-metal dielectric layers 125 include silicon oxide in the present embodiment. In other embodiments, the inter-level dielectric layer 120 and the inter-metal dielectric layers 125 may include fluorosilicate glass (FSG), low-k materials, or combination thereof. The low-k material can be defined as a dielectric material having its dielectric constant less than about 3.9, that of a thermal silicon oxide. The low-k materials may comprises carbon-doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials. Referring back to FIG. 4, the dielectric layers 130 serve as etch stop layers in the present embodiment and include silicon nitride. In an alternative embodiment, the dielectric layers 130 may include silicon oxy-nitride or silicon carbide.

The conductive lines 105-115 are interconnected by vias (or contacts) 140. The vias 140 are formed using a method that includes etching a trench that extends through the dielectric layers separating the conductive lines 105-115. For example, using a photolithography process, a trench is etched in the layers 125 and 130 in between the conductive lines 105 and 110. The trench is then filled with a conductive material, for example, tungsten. It is understood that other conductive materials may be used to form the vias 140 in other embodiments.

The conductive lines 105-115 have reflective properties that allow them to reflect radiation such as the light 50. Thus, a dummy conductive line 150 is formed above and is aligned with the pixel 40 in the present embodiment. The dummy conductive line 150 is not connected to any vias 140 and is used only as a reflector. Recall from the discussions regarding FIG. 3 that light 50B propagates through the distributed Bragg reflector formed by layers 60-90 and propagates into the interconnect structure 100. As light 50B hits the dummy conductive line 150, the dummy conductive line 150 reflects a portion of the light 50B toward the pixel 40 as light 50C. The reflected light 50C gets absorbed by the pixel 40 again. Thus, the dummy conductive line 150 enhances the quantum efficiency of the pixel 40 (and therefore the quantum efficiency of the image sensor 30) for the same reasons as discussed above regarding FIG. 3. It is understood that although FIG. 4 shows the dummy conductive line 150 being formed in the same layer as the conductive line 110, the dummy conductive line 150 may be formed in other layers in different embodiments, such as in the same layer as the conductive line 105. Further, the dummy conductive line 150 may be formed to have a size (or width) that suits design requirements and fabrication limitations.

Figure 5:
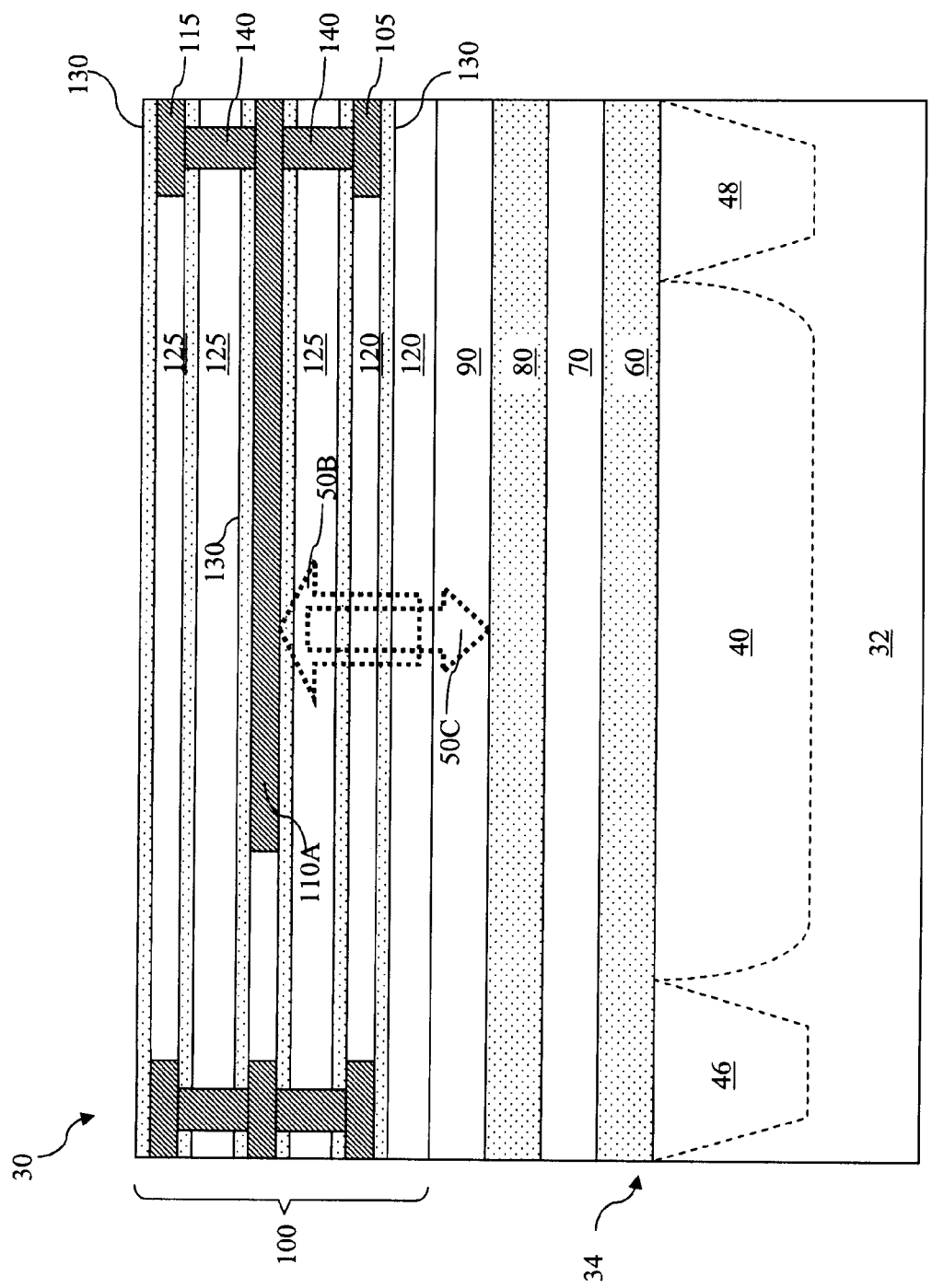

Referring now to FIG. 5, an alternative embodiment of the interconnect structure 100 is illustrated. The conductive line 110 is resized to become conductive line 110A that is partly above and partially aligned with the pixel 40. For the same reasons that were discussed above for FIG. 4, the resized conductive line 110A reflects light 50B toward the pixel 40, so that the quantum efficiency of the pixel 40 is increased. It is understood that although FIG. 5 shows the resizing of the conductive line 110, other conductive lines may be resized in different embodiments. For example, the conductive line 105 may be resized. Further, the resizing of the conductive line 110 may be carried out so that the resized conductive line 110A has a size (or width) that suits design requirements and fabrication limitations.

Figure 6:
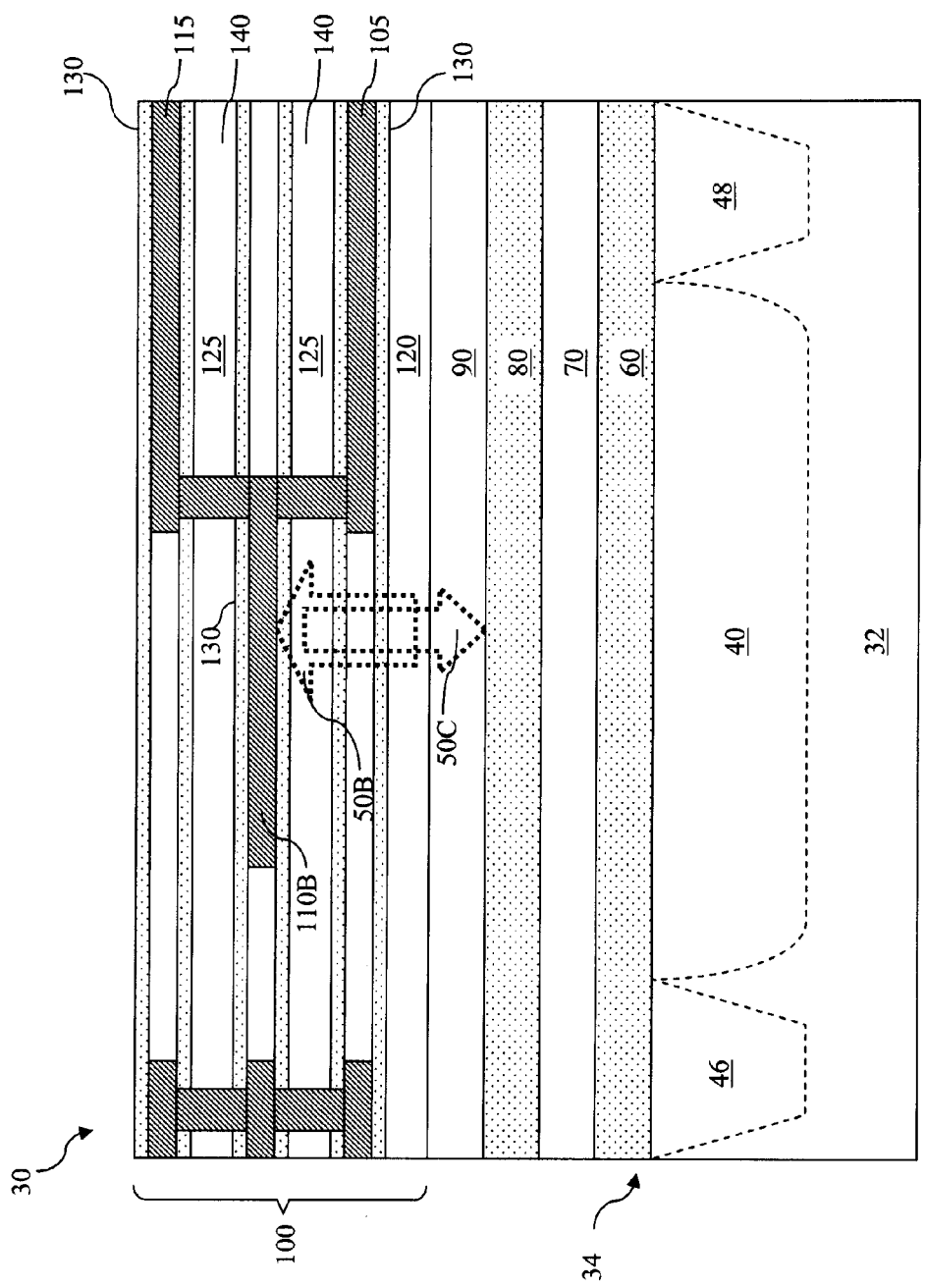

Referring now to FIG. 6, one more embodiment of the interconnect structure 100 is illustrated. The conductive line 110 is repositioned to become conductive line 110B that is partly above the pixel 40. For the same reasons that were discussed above for FIG. 4, the repositioned conductive line 110B reflects light 50B toward the pixel 40, so that the quantum efficiency of the pixel 40 is increased. It is understood that although FIG. 6 shows the conductive line 110 being repositioned, other conductive lines may be resized in different embodiments. For example, the conductive line 105 may be repositioned. Further, the repositioning of the conductive line 110 may be carried out so that the repositioned conductive line 110B has a size (or width) that suits design requirements and fabrication limitations.

Figure 7:
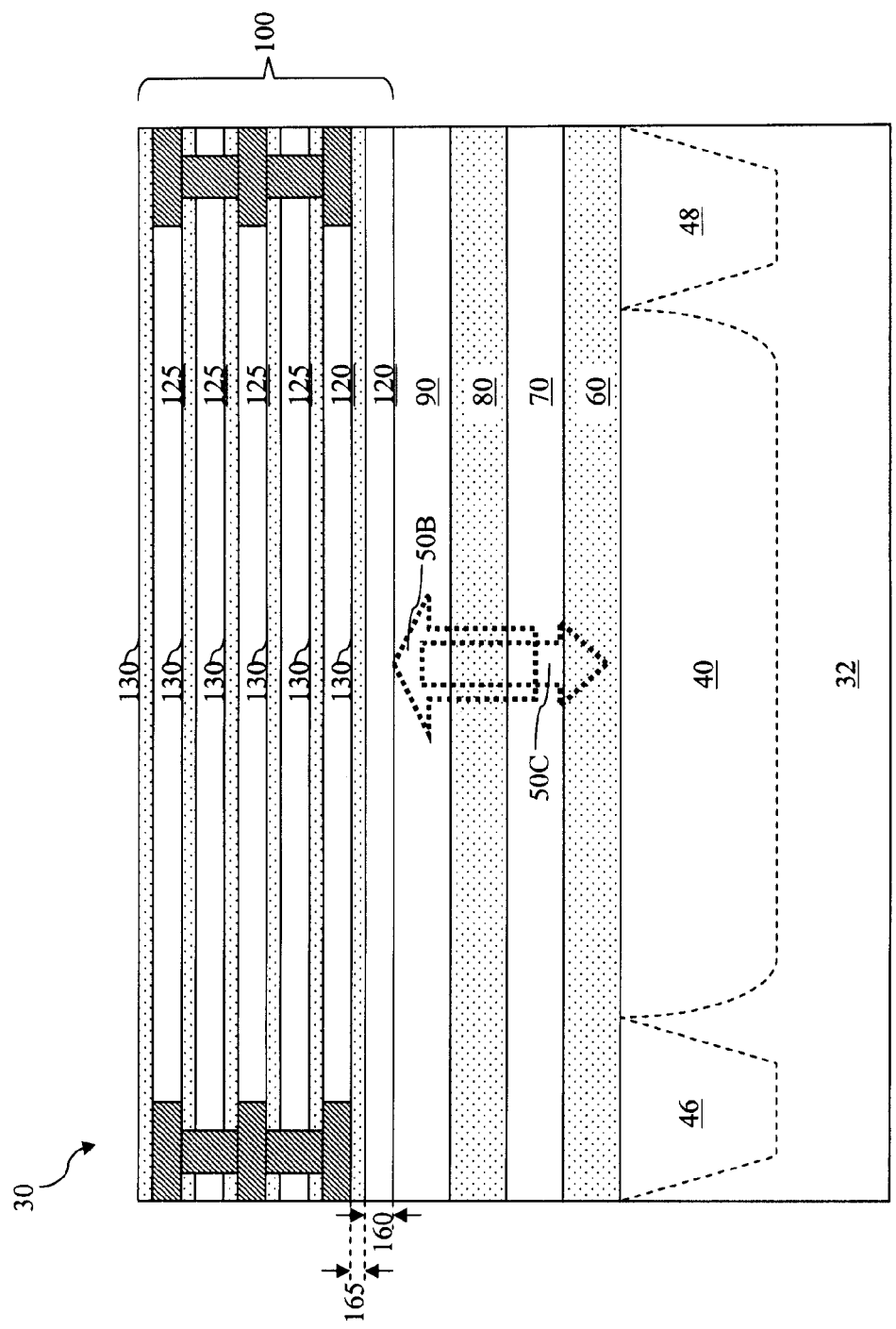

Referring now to FIG. 7, a further embodiment of the interconnect structure 100 is illustrated. In the embodiment shown in FIG. 7, thicknesses of the inter-level dielectric layer 120, the inter-metal dielectric layers 125 and the dielectric layers 130 are tuned such that the interconnect structure 100 becomes a reflector that reflects light 50B back toward the pixel 40. In one embodiment, the interconnect structure 100 is a distributed Bragg reflector discussed earlier in FIG. 3. For example, the inter-level dielectric layer 120 and the dielectric layer 130 have thicknesses 160 and 165, respectively. The inter-level dielectric layer 120 and the dielectric layer 130 also include respective refractive index values. In the embodiment shown in FIG. 7, the refractive index value for the inter-level dielectric layer 120 is about 1.46, since the inter-level dielectric layer 120 includes a silicon oxide material. The refractive index value for the dielectric layer 130 is about 2.3, since the dielectric layer 130 includes a silicon nitride material. The thickness 160 is approximately equal to $(¼)*$(wavelength of the light 50B)/(refractive index of the inter-level dielectric layer 120), and the thickness 165 is approximately equal to $(¼)*$(wavelength of the light 50B)/(refractive index of the dielectric layer 130). Thus, the thicknesses 160 and 165 vary in accordance with the wavelength of the light 50B, and a distributed Bragg reflector having $N=1$ is formed. Similarly, the thicknesses of the inter-metal layers 125 and other dielectric layers 130 of the interconnect structure 100 may be varied in accordance with the equations listed above so that a distributed Bragg reflector having $N>1$ is formed. For the same reasons as discussed above regarding FIG. 3, the distributed Bragg reflector formed by the interconnect structure 100 reflects light 50B back toward the pixel 40 so that the pixel 40 has an enhanced quantum efficiency. It is also understood that the embodiment shown in FIG. 7 may be combined with the embodiments shown in FIGS. 5-7.

Figure 8:
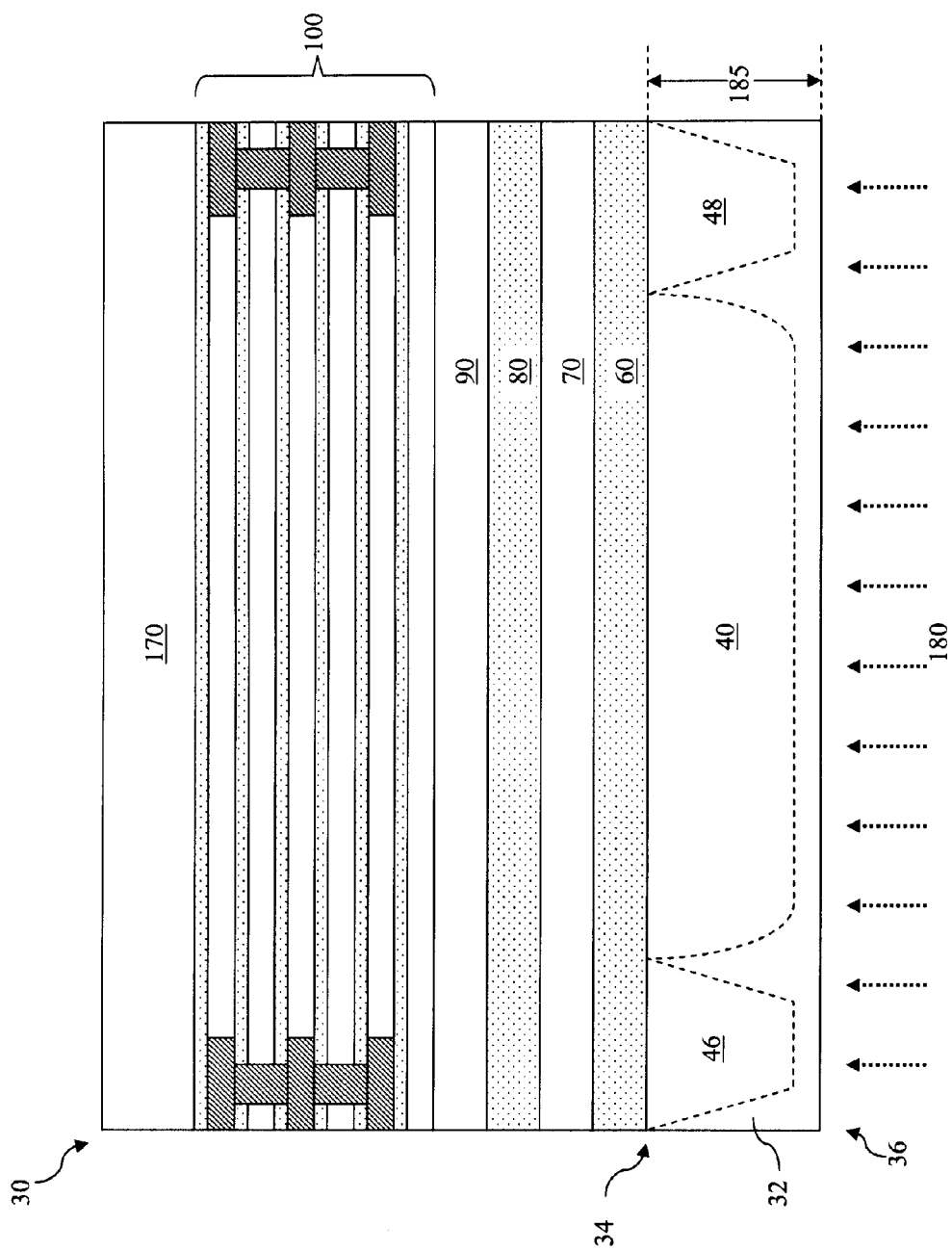

Referring now to FIG. 8, a carrier substrate 170 is bonded with the device substrate 32 from the front side 34, so that the processing of the backside 36 of the device substrate 32 can be performed. In the present embodiment, the carrier substrate 170 is bonded with the interconnect structure 100 by molecular forces—a technique known as direct bonding or optical fusion bonding, which may require smooth and flat bonding surfaces. In other embodiments, the carrier substrate 170 may be bonded with the interconnect structure 100 by techniques such as metal diffusion or anodic bonding known in the art. The carrier substrate 170 may be similar to the device substrate 32 and includes a silicon material. Alternatively, the carrier substrate 170 may optionally include a glass material. The carrier substrate 170 provides protection for the various features (such as the pixel 40) formed in the device substrate 32, and also provides mechanical strength and support for processing the backside 36 of the device substrate 32 as discussed below. It is understood that a buffer layer (not illustrated) may be formed on the interconnect structure 100 before bonding with the carrier substrate 170, so that a smooth and flat surface is available for better bonding performance, and electrical isolation between the device substrate 32 and the carrier substrate 170 is obtained.

After bonding, the device substrate 32 and the carrier substrate 170 may optionally be annealed to enhance the bonding strength. Thereafter, a thinning process 180 is performed to thin the device substrate 32 from the backside 36. The thinning process 180 may include a mechanical grinding process and a chemical thinning process. A substantial amount of substrate material may be first removed from the device substrate 32 during the mechanical grinding process. Afterwards, the chemical thinning process may apply an etching chemical to the back side 36 to further thin the device substrate 32 to a thickness 185. In the present embodiment, the thickness 185 is less than about 3 um. It is also understood that the particular thicknesses disclosed in the present disclosure are mere examples and that other thicknesses may be implemented depending on the type of application and design requirements of the image sensor device 30.

Figure 9:
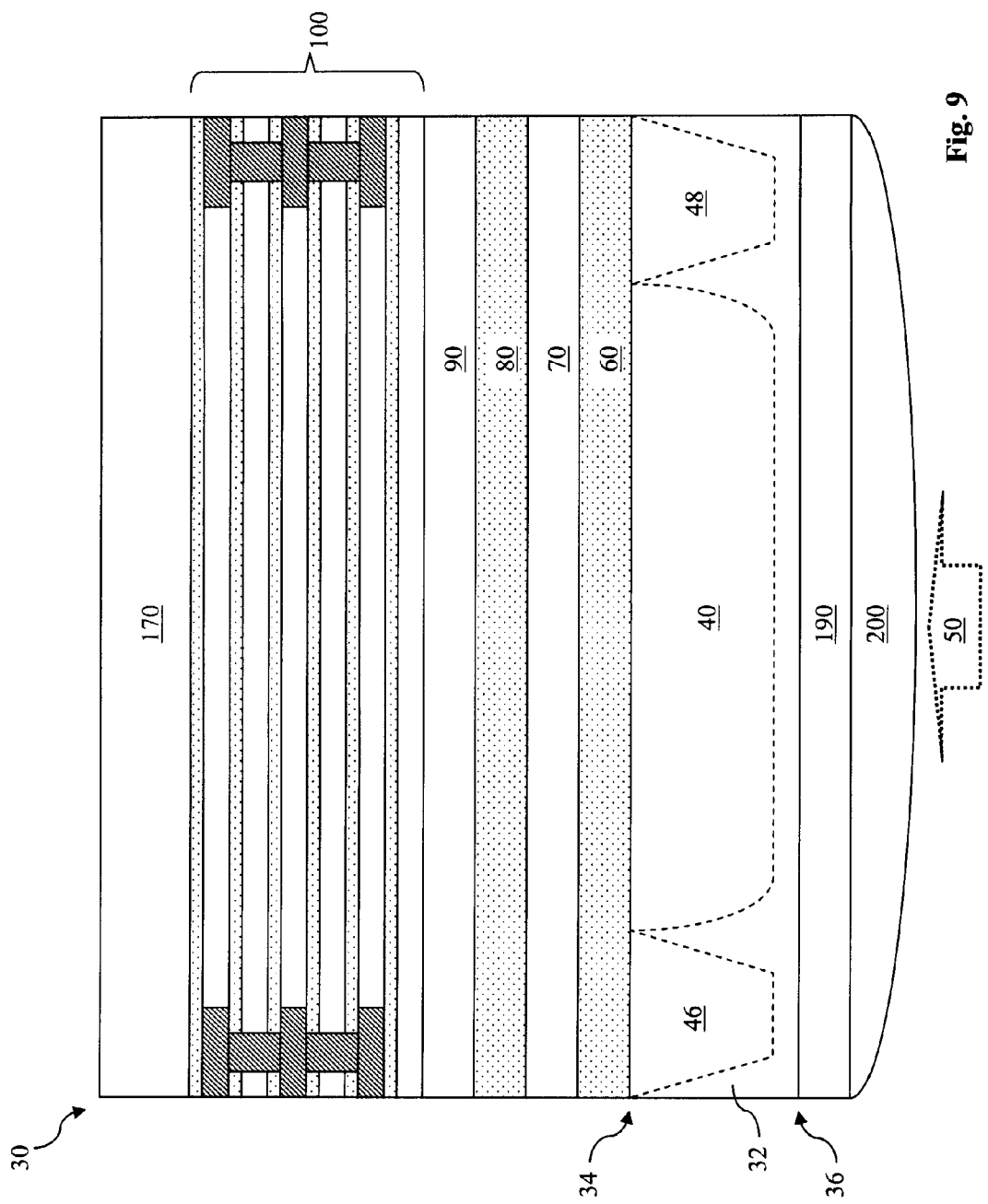

Referring now to FIG. 9, a color filter 190 is formed over the back side 36 of the device substrate 32. The color filter 190 may be positioned such that the incident light 50 is directed thereon and therethrough. The color filter 190 may include a dye-based (or pigment based) polymer or resin for filtering a specific wavelength band of the light 50, which corresponds to a color spectrum (e.g., red, green, and blue). In the present embodiment, the color filter is operable to filter a spectrum of light having a red color.

Thereafter, a micro-lens 200 is formed over the color filter 190 for directing and focusing radiation such as the light 50 toward the pixel 40 in the device substrate 32. The micro-lens 200 may be positioned in various arrangements and have various shapes depending on a refractive index of material used for the micro-lens and distance from a sensor surface. It is understood that the device substrate 32 may also undergo an optional laser annealing process before the forming of the color filter 190 or the micro-lens 200. Also, an anti-reflective-coating (ARC) layer may be optionally formed between the device substrate 32 and the color filter 190.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor device, comprising:
   a device substrate having a front side surface and a back side surface, the device substrate having a radiation-sensing region operable to sense radiation that has a corresponding wavelength, wherein the radiation first enters the device substrate from the backside surface of the device substrate;
   a dielectric structure disposed over the device substrate, the dielectric structure comprising a plurality of layers that include:
      a first layer formed over the front side surface of the device substrate, the first layer having a first refractive index and a first thickness that is a function of the first refractive index, wherein the first layer contains a first type of dielectric material;
      a second layer formed over the first layer, the second layer having a second refractive index and a second thickness that is a function of the second refractive index, wherein the second layer contains a second type of dielectric material different from the first type of dielectric material, wherein at least one of the first layer or the second layer has a uniform thickness;
   an interconnect structure disposed over the dielectric structure in a manner such that the dielectric structure is disposed between the device substrate and the interconnect structure, wherein the interconnect structure includes a plurality of interconnect layers, each interconnect layer containing one or more conductive elements; and
   a lens disposed over the back side surface of the device substrate, wherein the device substrate is disposed between the lens and the first layer.

2. The image sensor device of claim 1, wherein the first thickness is a function of the wavelength, and the second thickness is a function of the wavelength.

3. The image sensor device of claim 2, wherein the first thickness has a value that is approximately equal to (¼)*(wavelength/first refractive index), and the second thickness has a value that is approximately equal to (¼)*(wavelength/second refractive index).

4. The image sensor device of claim 1, wherein the first layer includes silicon oxide, and the second layer includes one of silicon nitride and silicon oxy-nitride.

5. The image sensor device of claim 1, further including:
   a third layer formed over the second layer, the third layer having a third refractive index that is approximately equal to the first refractive index and a third thickness that is approximately equal to the first thickness; and
   a fourth layer formed over the third layer, the fourth layer having a fourth refractive index that is approximately equal to the second refractive index and a fourth thickness that is approximately equal to the second thickness.

6. The image sensor device of claim 1, further including:
   a carrier substrate bonded to the device substrate from the front side surface; and
   a color filter formed over the back side surface of the device substrate.

7. The image sensor device of claim 1, wherein the metal film is one of a dummy metal film, a resized metal film, and a repositioned metal film, wherein at least one of the conductive elements of the interconnect layers is vertically aligned with the radiation-sensing region.

8. The image sensor device of claim 1, wherein the interconnect structure includes an etch stop layer, the etch stop layer having a third refractive index and a third thickness that is a function of the third refractive index and the wavelength.

9. A method of fabricating an image sensor device, comprising:
providing a device substrate having a front side surface and a back side surface;
forming a radiation-sensing region in the device substrate, the radiation-sensing region operable to sense radiation that has a corresponding wavelength, wherein the radiation is projected toward the radiation-sensing region from the back side surface of the device substrate and enters the device substrate first from the back side surface;
forming a dielectric structure that includes a plurality of layers over the front side surface of the device substrate, wherein the forming the dielectric structure includes:
forming a first layer over the front side surface of the device substrate, the first layer having a first refractive index and a first thickness that is a function of the first refractive index, wherein the first layer is formed in a manner such that the radiation can be received by the radiation-sensing region without first entering the first layer;
forming a second layer over the first layer, the second layer having a second refractive index and a second thickness that is a function of the second refractive index, wherein the first layer and the second layer contain different types of dielectric materials, wherein the forming the first layer and the forming the second layer is performed in a manner such that at least one of the first layer or the second layer has a uniform thickness; and
forming an interconnect structure over the dielectric structure in a manner such that the dielectric structure is disposed between the device substrate and the interconnect structure, the interconnect structure including a plurality of interconnect layers, wherein each interconnect layer contains one or more conductive elements.

10. The method of claim 9, wherein the forming of the first layer is carried out so that the first thickness is a function of the wavelength, and wherein the forming of the second layer is carried out so that the second thickness is a function of the wavelength.

11. The method of claim 10, wherein the forming of the first layer is carried out so that the first thickness has a value that is approximately equal to (¼)*(wavelength/first refractive index), and the forming of the second layer is carried out so that the second thickness has a value that is approximately equal to (¼)*(wavelength/second refractive index).

12. The method of claim 9, wherein the forming of the first layer is carried out so that the first layer includes silicon oxide, and the forming of the second layer is carried out so that the second layer includes one of silicon nitride and silicon oxynitride.

13. The method of claim 9, wherein the forming of the dielectric structure further includes:
forming a third layer over the second layer, the third layer having a third refractive index that is approximately equal to the first refractive index and a third thickness that is approximately equal to the first thickness; and
forming a fourth layer over the third layer, the fourth layer having a fourth refractive index that is approximately equal to the second refractive index and a fourth thickness that is approximately equal to the second thickness.

14. The method of claim 9, further including:
bonding a carrier substrate to the device substrate from the front side surface;
thinning the device substrate from the back side surface; and
forming a color filter over the back side surface of the device substrate.

15. The method of claim 14, wherein at least one of the conductive elements of the interconnect layers is disposed directly over the radiation-sensing region.

16. The method of claim 14, wherein the forming of the interconnect structure is carried out so that the interconnect structure includes an etch stop layer, the etch stop layer having a third refractive index and a third thickness that is a function of the third refractive index and the wavelength.

17. An image sensor device, comprising:
a device substrate having a front side surface and a back side surface;
a pixel formed in the device substrate, the pixel being operable to sense light projected first through the back side surface of the device substrate, the light having a corresponding wavelength;
a dielectric structure disposed over the device substrate, the dielectric structure comprising a plurality of layers that include:
a first dielectric layer formed over the front side surface of the device substrate, the first dielectric layer having a first refractive index and a first thickness that is a function of the first refractive index and the wavelength;
a second dielectric layer formed over the first dielectric layer, the second dielectric layer having a second refractive index and a second thickness that is a function of the second refractive index and the wavelength, wherein the first dielectric layer and the second dielectric layer contain different types of dielectric materials, wherein at least one of the first dielectric layer or the second dielectric layer has a uniform thickness;
a micro-lens disposed over the back side surface of the device substrate, wherein the device substrate is disposed between the micro-lens and the first dielectric layer; and
an interconnect structure disposed over the dielectric structure in a manner such that the dielectric structure is disposed between the device substrate and the interconnect structure, the interconnect structure having a plurality of interconnect layers that each contain one or more metal films.

18. The image sensor device of claim 17,
wherein the first thickness is approximately equal to (¼)*(wavelength/first refractive index); and
wherein the second thickness is approximately equal to (¼)*(wavelength/second refractive index).

19. The image sensor device of claim 17, further comprising a color filter formed over the back side surface of the device substrate.

20. The back-side illuminated image sensor device of claim 1, further comprising a color filter formed over the back side surface of the device substrate.

* * * * *